(12) United States Patent
Alkemper et al.

(10) Patent No.: US 7,129,010 B2
(45) Date of Patent: Oct. 31, 2006

(54) SUBSTRATES FOR IN PARTICULAR MICROLITHOGRAPHY

(75) Inventors: Jochen Alkemper, Klein-Winternheim (DE); Lutz Aschke, Mainz (DE); Hrabanus Hack, Mainz (DE)

(73) Assignee: Schott AG, Mainz (DE)

( * ) Notice: Subject to any disclaimer, the term of this patent is extended or adjusted under 35 U.S.C. 154(b) by 278 days.

(21) Appl. No.: 10/628,059

(22) Filed: Jul. 25, 2003

(65) Prior Publication Data

US 2004/0063004 A1    Apr. 1, 2004

(30) Foreign Application Priority Data

Aug. 2, 2002    (DE) ................ 102 35 731

(51) Int. Cl.
*G01F 9/00* (2006.01)
*B32B 17/06* (2006.01)
*B32B 9/00* (2006.01)

(52) U.S. Cl. .......................... 430/5; 428/428
(58) Field of Classification Search .............. 430/5; 359/359, 361; 427/160, 164; 428/428, 432, 428/336
See application file for complete search history.

(56) References Cited

U.S. PATENT DOCUMENTS

| 3,642,504 A | 2/1972 | Petzold et al. |
|---|---|---|
| 4,851,372 A | 7/1989 | Lindig et al. |
| 4,865,451 A | 9/1989 | Ahonen et al. |
| 4,904,083 A | 2/1990 | Lu et al. |
| 5,591,682 A | 1/1997 | Goto |
| 6,159,643 A | 12/2000 | Levinson et al. |
| 6,352,803 B1 | 3/2002 | Tong et al. |
| 6,387,572 B1 * | 5/2002 | Tong et al. .................... 430/5 |
| 6,576,380 B1 * | 6/2003 | Davis et al. .................. 430/5 |
| 6,835,503 B1 * | 12/2004 | Krauth ......................... 430/5 |

FOREIGN PATENT DOCUMENTS

| DE | 1 902 342 | 9/1970 |
|---|---|---|
| DE | 1 902 432 | 9/1970 |
| DE | 198 30 449 A1 | 1/2000 |
| DE | 101 27 086 | 12/2002 |
| EP | 1 095379 | 9/2002 |
| WO | 97/33132 | 8/1997 |
| WO | 01/07967 A1 | 2/2001 |
| WO | 01/08163 A1 | 2/2001 |

OTHER PUBLICATIONS

H. Bach: "Low Expansion Glass Ceramics", Schott Series on Glass and Glass Ceramics, Science, Technology and Application, Springer Verlag, Germany, 1995, pp. 1-223.

* cited by examiner

*Primary Examiner*—S. Rosasco
(74) *Attorney, Agent, or Firm*—Michael J. Striker

(57) ABSTRACT

The present invention relates to a substrate in particular of EUV microlithography, to the production of a substrate of this type and to the use of this substrate as a substrate for mirrors and/or masks or mask blanks in particular in EUV microlithography.

24 Claims, 1 Drawing Sheet

SUBSTRATES FOR IN PARTICULAR MICROLITHOGRAPHY

FIELD OF THE INVENTION

The present invention relates to substrates for EUV microlithography and precision components, to elements such as mirrors and/or masks or mask blanks for EUV microlithography and to the production of a substrate or an element of this type.

TECHNICAL BACKGROUND

The trend in the production of integrated circuits is towards increasingly small structures on the chips. To produce chips of this type, therefore, it is necessary to employ lithography systems which are able to operate with ever smaller exposure wavelengths. Wavelengths of 248, 193 and 157 nm are currently used or under development. The use of electromagnetic radiation in what is known as the extreme UV region, in particular in the region from 11 to 14 nm, has been proposed for such lithography systems of the future. In this region, it will be necessary to change from a transmission system which has hitherto been customary to a reflection system with reflective optical elements and masks. Hitherto, only a small number of substrates for masks and also mirrors for the associated optics which are able to satisfy the extreme demands imposed on this technology have been proposed for reflective systems of this type.

DE 198 30 449 A1 describes a mirror substrate in which an amorphous thin film of quartz glass, amorphous silicon dioxide or aluminium oxide is applied to a substrate body with a high thermal conductivity.

U.S. Pat. No. 6,159,643 describes a reflection mask, comprising a layer which forms a pattern and a substrate, the substrate having a surface layer with an optical planarity of a quarter of a wavelength or better and a lower layer with a coefficient of thermal expansion α (or CTE) of less than 1.0 ppm/° C. in particular silicon is used as covering layer.

These two documents describe the use of silicon as one of the layers in a substrate for EUV lithography. However, silicon has a high thermal conductivity and a high thermal expansion, which is disadvantageous for EUV lithography.

WO 01/07967 and WO 01/08163 A1 describe masks and mirrors for EUV lithography in which titanium-doped high-purity silica glass is used as substrate. However, on account of their specific production process, these materials are generally insufficiently homogeneous for use in EUV lithography.

On account of their extremely low thermal expansion and very good homogeneity, glass-ceramics, such as Zerodur® are suitable for use as masks and/or mirrors for EUV lithography.

For this reason, initial optical systems based on Zerodur® substrate have been produced. It has thereby been established that, although these surfaces can be polished to an in-spec surface roughness of 0.1 nm rms using conventional methods, this roughness is lost during the ion beam etch which is subsequently customary. The surface roughness is increased by a factor of 2 to 5 following this treatment. However, since the surface roughness of 0.1 nm rms are a requirement for substrates for EUV lithography, the use of substrates of this type for optical systems which are suitable for production purposes is restricted.

SUMMARY OF THE INVENTION

It is an object of the present invention to provide new types of substrates for mirrors and/or masks which can be used in EUV lithography and which do not have the drawbacks of the prior art.

The above object is achieved by means of the embodiments of the present invention described in the claims.

A first aspect of the present invention relates to a substrate for EUV microlithography (EUV "Extreme Ultraviolet"), comprising at least one covering layer and at least one base layer, the base layer having a coefficient of thermal expansion of at most 0.1 ppm/° C. and the covering layer having a coefficient of thermal expansion of at most 1.0 ppm/° C.

A second aspect of the present invention relates to a substrate for EUV microlithography, comprising a base layer and at least one covering layer, in which the base layer comprises ceramic and/or glass-ceramic and the covering layer comprises silicon dioxide.

A third aspect of the present invention relates to a process for producing a substrate for EUV microlithography, wherein the substrate comprises at least one covering layer and at least one base layer, the base layer having a coefficient of thermal expansion of at most 0.1 ppm/° C. and the covering layer having a coefficient of thermal expansion of at most 0.1 ppm/° C., wherein the process comprises the steps of
a) providing a base layer which has a coefficient of thermal expansion of at most 0.1 ppm/° C.,
(b) applying a covering layer which has a coefficient of thermal expansion of at most 1.0 ppm/° C., and
(c) if appropriate, polishing the covering layer.

A fourth aspect of the present invention relates to an element (such as a mask or mirror) for EUV microlithography, comprising a substrate and a reflective layer;
wherein the substrate comprises at least one covering layer and at least one base layer, the base layer having a coefficient of thermal expansion of at most 0.1 ppm/° C. and the covering layer having a coefficient of thermal expansion of at most 1.0 ppm/° C.

A fifth aspect of the present invention relates to a process of producing an element for EUV microlithography, wherein the element comprises a substrate and a reflective coating; and wherein the substrate comprises at least one covering layer and at least one base layer, the base layer having a coefficient of thermal expansion of at most 0.1 ppm/° C. and the covering layer having a coefficient of thermal expansion of at most 1.0 ppm/° C.;

the process comprising the steps of
(A) providing at least one base layer which has a coefficient of thermal expansion of at most 0.1 ppm/° C.,
(B) applying at least one covering layer which has a coefficient of thermal expansion of at most 1.0 ppin/° C.,
(C) if appropriate, polishing the covering layer, and
(D) providing a reflective coating on the covering layer of the substrate.

According to a sixth aspect the present invention relates to a substrate for precision components comprising a base layer and at least one covering layer, the base layer having a coefficient of thermal expansion of at most 0.1 ppm/° C. and the covering layer having a coefficient of thermal expansion of at most 1 ppm/° C.; wherein the surface roughness of the covering layer is at most 1 nm rms.

Additional features and advantages of the invention will be set forth in the detailed description which follows, and in part will be readily apparent to those skilled in the art from that description or recognized by practicing the invention as described herein, including the detailed description which follows, the claims, as well as the appended Figures.

It is to be understood that both the foregoing general description and the following detailed description are merely exemplary of the invention, and are intended to provide an overview or framework for understanding the nature and character of the invention as claimed.

DETAILED DESCRIPTION OF THE INVENTION

Figure 1:
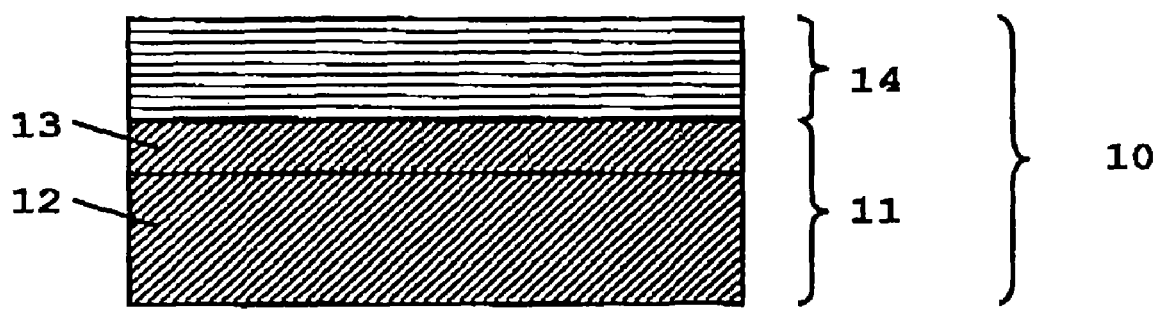
FIG. 1 is a schematic cross-sectional view of a substrate according to the invention embodied as a mirror for EUV microlithography.

In a first and second aspect, the present invention relates to a substrate for EUV microlithography (EUV "Extreme Ultraviolet"), comprising at least one covering layer and at least one base layer.

In accordance with the invention, the "extreme UV" region encompasses in particular electromagnetic radiation with a wavelength in the region from 11 to 14 nm.

According to the invention, it has been found that the disadvantages of the above-described materials, such as the glass-ceramics and/or ceramics, can surprisingly be eliminated by the application of a covering layer with a low thermal expansion, comprising, for example, silicon dioxide, to a lower layer, comprising a material with a very low thermal expansion, such as a glass-ceramic. In particular, this base layer may have poor surface roughness and yet it is still possible to provide the surface roughness, which is required for microlithography, by means of the covering layer.

The substrate according to the invention therefore has at least a two-layer structure, with at least one so-called base layer and at least one so-called covering layer being present.

The substrate according to the invention, comprising at least one base layer and at least one covering layer, preferably has a low thermal expansion (CTE≦1 ppm/° C.) compared to a metal or semi metal, such as silicon (CTE>2 ppm/° C.), as substrate material.

According to one embodiment, the base layer has a coefficient of thermal expansion of at most 0.1 ppm/° C. and the covering layer has a coefficient of thermal expansion of at most 1.0 ppm/° C.

The base layer or base layers particularly preferably has/have what is known as a near zero expansion, as defined below. The covering layer(s) and/or preferably also the other layers which may be present also have a low thermal expansion of ≦1.0 ppm/° C., preferably ≦0.5 ppm° C.

A base layer or lower layer is understood as meaning that or those layers of a substrate which is/are remote from what will subsequently be the substrate surface, carrying for example a reflective surface of a mask or a mirror for EUV lithography.

In accordance with the invention, the at least one base layer preferably comprises a material with a very low coefficient of thermal expansion α (or CTE). This layer or the material used for this layer preferably has a coefficient of thermal expansion of at most 0.1 ppm/° C., more preferable a coefficient of thermal expansion of at most 10 ppb/° C. It is preferably what is known as a "near or virtual zero expansion material", which in a temperature range from −40° C. to +400° C., preferably in a temperature range from 0° to 50° C., does not essentially undergo any change in dimension, i.e. has a CTE of preferably at most 10 ppb/° C.

The base layer of the substrate according to the invention preferably comprises a ceramic and/or glass-ceramic. Examples of glass-ceramics which may be mentioned include the commercially available products Zerodur® (available from SCHOTT Glas, Hattenbergstraβe 10, Mainz, Germany), Zerodur M® (available from SCHOTT Glas, Hattenbergstraβe 10, Mainz, Germany), Clearceram® (available from Ohara Inc., Kanagawa, Japan) or Clearceram® Z (available from Ohara Inc., Kanagawa, Japan) or other glass-ceramics with a low thermal expansion. One type of suitable glass-ceramics including Clearceram® are described in U.S. Pat. No. 5,591,682 which is herein incorporated by reference. Suitable ceramics are ceramics with a coefficient of thermal expansion of ≦0.1 ppm, such as for example cordierite-containing ceramics, or alternatively composite materials and material composites (e.g. fibre-reinforced materials with a low thermal expansion) SiC, aluminium oxide and/or mixtures thereof can also be used as substrate material.

Glass-ceramics are inorganic, non-porous materials with a crystalline phase and a vitreous phase.

In accordance with the invention, Zerodur® and its variants (e.g. Zerodur® M) are preferred for use as the base layer.

Zerodur® was first described in DE 19 02 432. Zerodur® M is a Zerodur® composition which is substantially free of magnesium oxide and is described, for example, in U.S. Pat. No. 4,851,372. Properties and composition of Zerodur® and Zerodur® M are known from the prior art and have been described, for example, in "Low Expansion Glass Ceramics", H. Bach (editor), Schott Series on Glass and Glass Ceramics, Science Technology, and Applications, Springer Verlag, Germany. The cited publications relating to Zerodur® and similar glass-ceramics are herein incorporated by reference.

Zerodur® contains 70 to 80 percent by weight crystal phase or crystalline phase with the so-called betaquartz structure. This has a negative linear thermal expansion, whereas that of the vitreous phase or the glass phase is positive. The particular composition of the base glass of the glass-ceramic Zerodur® and defined crystal nucleation and crystallization conditions result in a material with an extremely low thermal expansion which in certain temperature ranges may be zero or slightly negative.

The thickness of the base layer is preferably at least 5 mm, so that its physical properties, in particular its thermal expansion, determine those of the overall substrate system comprising base layer and covering layer. The surface roughness of the base layer prior to application of the covering layer is preferably at most 1 nm rms, more preferably at most 0.5 nm rms.

The base layer may be composed of one layer or a plurality of two or more layers, if appropriate with different compositions and/or different physical properties. However, it is preferred that the base layer is composed of only one layer.

According to the invention, at least one covering layer is arranged above the base layer, resulting in an at least two-layer substrate for EUV lithography.

The covering layer may be composed of a plurality of individual layers, if appropriate with different compositions and/or different physical properties. By way of example, the doping of the covering layer may change suddenly or gradually on the side which is close to the base layer compared to the side which is remote from the base layer. Wherever the following text uses the term covering layer, this term is to be understood as meaning the overall covering layer, which if appropriate may be composed of a plurality of individual layers.

The covering layer and/or the material of the covering layer has a coefficient of thermal expansion of at most 1.0 ppm/° C., preferably at most 0.5 ppm/° C.

The covering layer preferably has a thickness of from 0.01 to 100 µm, more preferably from 0.01 to 50 µm, even more preferably from 0.1 to 50 µm, most preferably 0.1 to 10 µm. Furthermore, this covering layer preferably has a surface roughness of at most 0.5 nm rms, more preferably of at most 0.2 nm rms and most preferably at most 0.1 nm rms.

The covering layer preferably comprises silicon dioxide, which if appropriate may be doped with titanium oxide and/or other metal oxides and/or fluorine and/or mixtures of the these components. By doping with titanium oxide, it is possible to match the coefficient of thermal expansion of a silicon dioxide covering layer to the coefficient of thermal expansion of the base layer. It is preferable for a silicon dioxide covering layer to be doped with a titanium oxide content of 5 to 10% by weight.

The substrate according to the invention may if appropriate comprise a bonding layer between the base layer and the covering layer. However, it is more preferable for the covering layer to be applied direct to the base layer. It has been found that, probably on account of the low thickness of the covering layer and the only slightly different coefficients of thermal expansion of covering layer and base layer, the covering layer does not develop any cracks even in the event of temperature changes, but rather remains unaffected even after heating and cooling cycles and continues to adhere securely to the base layer.

According to a preferred embodiment, the covering layer completely covers the surface of the base layer. However, according to the invention it is possible for the covering layer not to cover e.g. an edge region of the base layer.

According to another aspect the present invention relates to the production of the substrate according to the invention for EUV microlithography, wherein the substrate comprises at least one covering layer and at least one base layer, the base layer having a coefficient of thermal expansion of at most 1.0 ppm/° C. and the covering layer having a coefficient of thermal expansion of at most 1.0 ppm/° C., wherein the process comprises the steps of a) providing a base layer which has a coefficient of thermal expansion of at most 0.1 ppm/° C., (b) applying a covering layer which has a coefficient of thermal expansion of at most 1.0 ppm/° C., and (c) if appropriate, polishing the covering layer.

It is preferable for the base layer provided to be polished to a roughness of at most 1 nm rms, preferably at most approximately 0.5 nm rms.

The covering layer is applied to this base layer preferably by a CVD process (CVD: Chemical Vapour Deposition), such as in particular a PICVD process (PICVD=Plasma Impulse CVD), PACVD process (PACVD Plasma Assisted CVD) or PECVD process (PECVD=Plasma Enhanced CVD). However, it is also possible to use other processes which are known in the prior art, such as for example a sol-gel process, a PVD process (PVD=Physical Vapour Deposition) and/or sputtering, if appropriate with the assistance of ion bombardment.

In the case of a CVD process, coatings are produced on a surface by reacting inorganic and/or organic precursor materials and depositing the reaction products on the surface.

In the case of a PECVD process, organic or inorganic precursors of the layer which is to be formed, which are present in a vapour phase, known as a plasma, are activated by a glow discharge. The reaction products are then deposited as a thin film on the surface which is to be coated. Layers produced in this way have a high packing density (>98%) and are very stable with respect to environmental influences.

In the case of a PICVD process, precursor materials of the dielectric material which is to be formed, in a vapour state, together with oxygen and if appropriate a carrier gas, are introduced directly into a microwave discharge chamber, and this mixture, i.e. the plasma, is ignited by a microwave discharge. The steps of admitting the plasma into the coating chamber and igniting it by means of a microwave pulse are carried out a number of times, resulting in a "pulsed" process sequence. This process is distinguished by high deposition rates (typically 5 to 15 nm/s) and a good homogeneity (for example a deviation of ≦1.5% over a radius of approx. 90 mm).

In the case of sputtering processes, in addition to pure material (elements and simple compounds), it is also possible for glasses, glass-ceramics and ceramics to be used as the sputtering target. In this way, it is possible for even complex compositions to be produced as the covering layer.

It is preferable to apply a covering layer which comprises silicon dioxides. A covering layer of this type may if appropriate be doped with the abovementioned dopants. This doping can be used to match the coefficient of thermal expansion of the covering layer to that of the base layer. A matching operation of this type will not generally be required, since, for example quartz glass already has a relatively low thermal expansion coefficient and, furthermore, according to preferred embodiments the covering layer is relatively thin compared to the base layer.

The covering layer is preferably applied in a thickness of from 0.01 to 100 µm, more preferably from 0.01 to 50 µM, even more preferably from 0.1 to 50 µm, most preferably from 0.1 to 10 µm. If it is necessary to polish the covering layer, so that part of the covering layer is removed by the polishing operation, a layer thickness which corresponds to the sum of the desired thickness of the covering layer and the thickness of the layer removed by the polishing operation is applied.

After the covering layer has been applied, it can be polished if necessary. However, according to one embodiment, the covering layer has the required surface roughness of at most 0.5 nm rms, more preferably at most 0.2 nm rms, particularly preferably at most 0.1 nm rms simply as a result of the application process. If the surface roughness of this covering layer is still above the required level, the layer is preferably polished.

If appropriate, the covering layer can be processed further by means of an ion beam process (what is known as ion beam figuring (IBF)) or by magneto-rheological polishing.

In the case of the IBF process, an ion beam is used as a tool for removing a desired thickness of material on a surface. Since the etching rate of the ion beam is low (typically 100 nm/min), this process is only suitable for removing a small thickness of material (at most a few µm).

In the case of ion beam figuring, virtually individual atomic layers are removed by ion bombardment.

The substrates according to the present invention can be used as substrates for elements for EUV microlithography such a's masks, mask blanks and/or mirrors for microlithography.

Thus, another aspect of the present invention relates to an element (such as a mask or mirror) for EUV microlithography, comprising a substrate and a reflective coating; wherein the substrate comprises at least one covering layer and at least one base layer, the base layer having a coefficient of thermal expansion of at most 0.1 ppm/° C. and the covering layer having a coefficient of thermal expansion of at most 1.0 ppm/° C.

Between the covering layer of the substrate and the reflective layer, a bonding layer may be provided.

However, it is preferred to apply the reflective layer directly on the covering layer of the substrate.

The reflective layer may preferably be a multilayer coating, even more preferably alternating layers of Mo and Si with a Mo thickness of about 2.8 nm and the Si thickness of about 5.0 nm. Such a reflective MoSi multilayer may be provided with an about 4 nm thick Si capping layer to prevent oxidation of Mo on exposure to normal atmospheres.

In case the element for EUV microlithography is a mirror, the element or at least the surface of the element may either be planar or curved as appropriate. To impart a curved surface to the mirror, it is possible for the base layer to he provided in the desired net shape. Then, the covering layer, a bonding layer if necessary and a reflective layer are applied.

FIG. 1 shows a schematic cross-section of one embodiment of a planar mirror 10 according to the invention. The substrate 11 is composed of a base layer 12 and a covering layer 13. On the covering layer 13 a reflective layer 14 is provided which may be composed of a multilayer.

In case the element for EUV microlithography is a mask or mask blank, such element comprises a substrate according to the present invention, a layer reflective to EUV radiation, provided on the substrate, and an absorbing layer, provided on the reflective layer.

The absorbing layer comprises at least one EUV radiation absorbing element, such as Cr, Al, Ti, Ta or the like or mixtures thereof.

Figure 2:
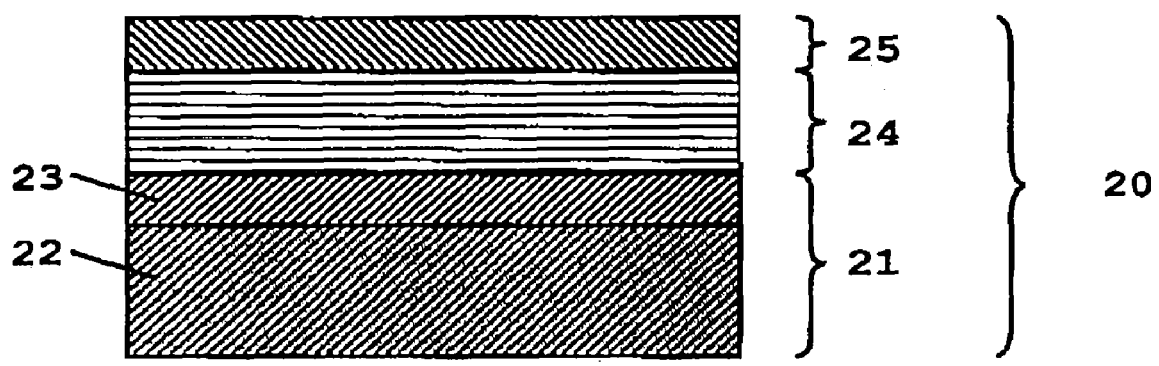
FIG. 2 is a schematic cross-sectional view of a substrate according to the invention embodied as a mask blank for EUV microlithography.

FIG. 2 shows a schematic cross-section of one embodiment of a mask blank 20 according to the invention. The substrate 21 is composed of a base layer 22 and a covering layer 23. On the covering layer 23 a reflective layer 24 is provided which may be composed of a multiplayer coating. An absorbing layer 25 is provided on the reflective layer 24.

Figure 3:
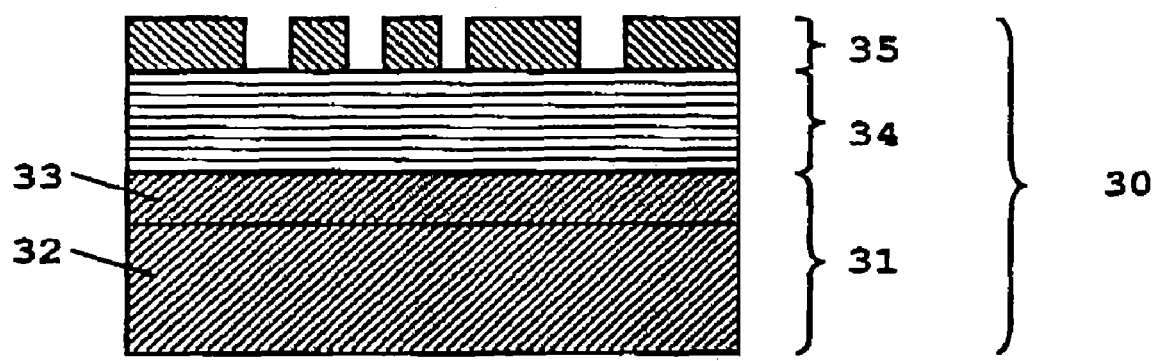
FIG. 3 is a schematic cross-sectional view of a substrate according to the invention embodied as a mask for EUV microlithography.

FIG. 3 shows a schematic cross-section of one embodiment of a patterned mask 30 according to the invention. The substrate 31 is composed of a base layer 32 and a covering layer 33. On the covering layer 33 a reflective layer 34 is provided which may be composed of a multiplayer coating. The absorbing layer 35 provided on the reflective layer 34 has been patterned to form a mask for microlithography.

Another aspect of the present invention relates to a process of producing an element for EUV microlithography, wherein the element comprises a substrate and a reflective layer; and wherein the substrate comprises at least one covering layer and at least one base layer, the base layer having a coefficient of thermal expansion of at most 0.1 ppm/° C. and the covering layer having a coefficient of thermal expansion of at most 1.0 ppm/° C.;

the process comprising the steps of
(A) providing at least one base layer which has a coefficient of thermal expansion of at most 0.1 ppm/° C.,
(B) applying at least one covering layer which has a coefficient of thermal expansion of at most 1.0 ppm/° C.,
(C) if appropriate, polishing the covering layer, and
(D) providing a reflective layer on the covering layer of the substrate.

In case a mask or, mask blank for EUV lithography shall be provided, the process comprises the further step of providing an absorbing layer as described above on the reflective layer.

Preferably, further layers on the substrate such as the reflective layer and in case of the mask blanks the EUV radiation absorbing layer are provided on the substrate using a PVD or sputtering process.

Substrates according to the invention may also be used in technical fields different from EUV microlithography. In particular, Substrates according to the invention may be used in all technical fields requiring substrates with a low surface roughness and low thermal expansion of the component.

Therefore, a sixth aspect of the invention relates to a substrate for precision components comprising a base layer and at least one covering layer, the base layer having a coefficient: of thermal expansion of at most 0.1 ppm/° C. and the covering layer having a coefficient of thermal expansion of at most 1 ppm/° C.; wherein the surface roughness of the covering layer is at most 1 nm rms. According to the sixth aspect of the invention the expression "precision components" also includes optical elements, such as mirrors and the like.

Preferably the surface roughness of the covering layer of a substrate for precision components is at most 0.5 nm rms, more preferably at most 0.2 nm rms, particularly preferably at most 0.1 nm rms. The sixth aspect of the invention is particularly useful for precision components treated by IBF or the like processes.

According to the sixth aspect of the invention, the at least one base layer preferably comprises a material with a very low coefficient of thermal expansion α (or CTE). This layer or the material used for this layer preferably has a coefficient of thermal expansion of at most 0.1 ppm/° C.; more preferable a coefficient of thermal expansion of at most 10 ppb/° C. It is preferably what is known as a "near or virtual zero expansion material", which in a temperature range from −40° C. to +400° C., preferably in a temperature range from 0° to 50° C., does not essentially undergo any change in dimension, i.e. has a CTE of preferably at most 10 ppb/° C.

The base layer of the substrate according to the invention preferably comprises a ceramic and/or glass-ceramic. Examples of glass-ceramics which may be mentioned include the commercially available products Zerodur® (available from SCHOTT Glas, Hattenbergstraße 10, Mainz, Germany), Zerodur M® (available from SCHOTT Glas, Hattenbergstraße 10, Mainz, Germany), Clearceram® (available from Ohara Inc., Kanagawa, Japan) or Clearceram® Z (available from Ohara Inc., Kanagawa, Japan) or other glass-ceramics with a low thermal expansion. One type of suitable glass-ceramics including Clearceram® are described in U.S. Pat. No. 5,591,682 which is herein incorporated by reference. Suitable ceramics are ceramics with a coefficient of thermal expansion of ≦0.1 ppm, such as for example cordierite-containing ceramics, or alternatively composite materials and material composites (e.g. fibre-reinforced materials with a low thermal expansion). SiC, aluminium oxide and/or mixtures thereof can also be used as substrate material.

In accordance with the invention, Zerodur® and its variants (e.g. Zerodur® M) are preferred for use as the base layer. Zerodur® was first described in DE 19 02 432. Zerodur® M is a Zerodur® composition which is substantially free of magnesium oxide and is described, for example, in U.S. Pat. No. 4,851,372. Properties and composition of Zerodur® and Zerodur® M are know from the prior art and have been described, for example, in "Low Expansion Glass Ceramics", H. Bach (editor), Schott Series on Glass and Glass Ceramics, Science, Technology, and Applications, Springer Verlag, Germany.

The cited publications relating to Zerodur® and similar glass-ceramics are herein incorporated by reference.

Zerodur® contains 70 to 80 percent by weight crystal phase or crystalline phase with the so-called betaquartz structure. This has a negative linear thermal expansion, whereas that of the vitreous phase or the glass phase is positive. The particular composition of the base glass of the glass-ceramic Zerodur® and defined crystal nucleation and crystallization conditions result in a material with an extremely low thermal expansion which in certain temperature ranges may be zero or slightly negative.

The base layer according to the sixth aspect of the invention may be composed of one layer or a plurality of two or more layers, if appropriate with different compositions and/or different physical properties. However, it is preferred that the base layer is composed of only one layer.

At least one covering layer is arranged above the base layer, resulting in an at least two-layer substrate for precision components.

The covering layer may be composed of a plurality of individual layers, if appropriate with different compositions and/or different physical properties. By way of example, the doping of the covering layer may change suddenly or gradually on the side which is close to the base layer compared to the side which is remote from the base layer.

The covering layer and/or the material of the covering layer has a coefficient of thermal expansion of at most 1.0 ppm/° C., preferably at most 0.5 ppm/° C.

The covering layer preferably has a thickness of from 0.01 to 100 μm, more preferably from 0.01 to 50 μm, even more preferably from 0.1 to 50 μm, most preferably 0.1 to 10 μm.

The covering layer preferably comprises silicon dioxide, which if appropriate may be doped with titanium oxide and/or other metal oxides and/or fluorine and/or mixtures of the these components. By doping with titanium oxide, it is possible to match the coefficient of thermal expansion of a silicon dioxide covering layer to the coefficient of thermal expansion of the base layer. It is preferable for a silicon dioxide covering layer to be doped with a titanium oxide content of 5 to 10% by weight.

The substrate according to the invention may it appropriate comprise a bonding layer between the base layer and the covering layer. However, it is more preferable for the covering layer to be applied direct to the base layer.

According to a preferred embodiment, the covering layer completely covers the surface of the base layer.

However, according to the invention it is possible for the covering layer not to cover e.g. an edge region of the base layer but only the area in which precision in view of surface roughness is required.

The method for the production of the substrate for precision components is the same as described above for the substrate for EUV microlithography.

EXAMPLES

Example 1

A base layer of Zerodur® (Expansion Class 0, available from SCHOTT Glas, Hattenbergstraβe 10, Mainz, Germany) having a thickness of 5 mm and a surface roughness of 0.1 nm rms was coated using a PICVD process with an over layer of $SiO_2$ having a thickness of 1.5 μm. The covering layer was polished to a surface roughness of 0.5 nm rims.

The covering layer adhered tightly to the base layer and did not show cracks after cycles of heating to an elevated temperature and cooling down to room temperature again. The surface roughness of the substrate did not increase during an IBF process.

Example 2

A base layer of Zerodur® (Expansion Class 0, available from SCHOTT Glas, Hattenbergstraβe 10, Mainz, Germany) having a thickness of 5 mm and a surface roughness of 0.1 nm rms was coated using a sputtering process ($SiO_2$ target doped with 7.5 wt.-% of $TiO_2$) with an over layer of Ti-doped $SiO_2$ having a thickness of 1.5 μm. The covering layer was polished to a surface roughness of 0.5 nm rms.

The covering layer adhered tightly to the base layer and did not show cracks after cycles of heating to an elevated temperature and cooling down to room temperature again. The surface roughness of the substrate did not increase during IBF process.

The invention claimed is:

1. A substrate for extreme ultraviolet (EUV) microlithography, wherein said substrate comprises
    a base layer consisting of a ceramic or glass ceramic material having a coefficient of thermal expansion of at most 0.1 ppm/° C.; and
    a covering layer adhering to the base layer, said covering layer comprising silicon dioxide or Ti-doped silicon dioxide and having a surface roughness of at most 0.5 nm rms and a coefficient of thermal expansion of at most 1 ppm/° C. said covering layer comprising at least one individual layer.

2. A substrate for extreme ultraviolet (EUV) microlithography, wherein said substrate comprises
    a base layer consisting of a ceramic or glass ceramic material having a coefficient of thermal expansion of at most 10 ppb/° C.; and
    a covering layer adhering to the base layer, said covering layer having a surface roughness of at most 0.5 nm rms and a coefficient of thermal expansion of at most 0.5 ppm/° C., said covering layer comprising at least one individual layer.

3. The substrate as defined in claim 2, wherein said covering layer comprises silicon dioxide and at least one dopant, said at least one dopant comprising at least one other metal oxide, F or a mixture thereof.

4. The substrate as defined in claim 3, wherein said at least one dopant is $TiO_2$ and said $TiO_2$ is included in said covering layer in an amount such that said coefficient of thermal expansion of said covering layer matches said coefficient of thermal expansion of said base layer.

5. The substrate as defined in claim 2, wherein said base layer has a thickness that is at least 5 mm and said covering layer has a thickness of from 0.01 to 100 μm, so that physical properties of the substrate are determined by physical properties of said base layer.

6. The substrate as defined in claim 2, wherein said covering layer is provided on said base layer by a method comprising applying said covering layer on said base layer by one of a chemical vapor deposition process, a sputtering process with or without ion bombardment and a sol-gel process.

7. A process for producing a substrate for extreme ultraviolet (EUV) microlithography, wherein said substrate comprises a base layer and a covering layer applied over the base layer, said base layer consists of a ceramic or glass ceramic material having a coefficient of thermal expansion of at most 10 ppb/° C. and said covering layer has a surface roughness of at most 0.5 nm rms and a coefficient of thermal expansion of at most 0.5 ppm/° C., said covering layer comprising at least one individual layer, wherein the process comprises the steps at a) providing said base layer of said ceramic or said glass ceramic material with said coefficient of thermal expansion of at most 10 ppb/° C., b) applying said covering layer over said base layer, said covering layer having said coefficient of thermal expansion of at most 0.5 ppm/° C., and then c) if appropriate, polishing the covering layer.

8. The process as defined in claim 7, wherein said covering layer is applied by one of chemical vapor deposition, sputtering with or without ion bombardment and a sol-gel process.

9. The process as defined in claim 7, wherein said covering layer comprises silicon dioxide and $TiO_2$ and said $TiO_2$ is included in said covering layer in an amount such that said coefficient of thermal expansion of said covering layer matches said coefficient of thermal expansion of said base layer.

10. The process as defined in claim 7, wherein said base layer has a thickness that is at least 5 mm and said covering layer has a thickness of from 0.01 to 100 μm, so that physical properties of the substrate are determined by physical properties of said base layer.

11. The process as defined in claim 7, wherein said covering layer is applied to said base layer by chemical vapor deposition and said chemical vapor deposition comprises plasma enhanced chemical vapor deposition, plasma assisted chemical vapor deposition or plasma impulse vapor deposition.

12. The process as defined in claim 7, wherein said covering layer is after-treated by an ion beam figuring process.

13. The process as defined in claim 7, wherein said covering layer comprises silicon dioxide and further comprising doping said covering layer with at least one other metal oxide, F or a mixture thereof.

14. An element for extreme ultraviolet microlithography, comprising a substrate and a reflective layer provided on the substrate;

wherein said substrate comprises a base layer consisting of a ceramic or glass ceramic material having a coefficient of thermal expansion of at most 10 ppb/° C. and a covering layer applied over the base layer, said covering layer having a surface roughness of at most 0.5 nm rms and a coefficient of thermal expansion of at most 0.5 ppm/° C., said covering layer comprising at least one individual layer and said reflective layer adhering to the covering layer.

15. The element as defined in claim 14, wherein the reflective layer is a multilayer coating consisting of alternating layers of Mo and Si.

16. The element as defined in claim 14, consisting of a mirror for extreme ultraviolet microlithography.

17. The element as defined in claim 14, consisting of a mask or mask blank for extreme ultraviolet microlithography.

18. The element as defined in claim 14, further comprising an absorbing layer, provided on the reflective layer.

19. The element as defined in claim 14, wherein said covering layer comprises silicon dioxide and at least one dopant comprising at least one other metal oxide, F or a mixture thereof.

20. The element as defined in claim 19, wherein said at least one dopant is $TiO_2$ and said $TiO_2$ is included in said covering layer in an amount such that said coefficient of thermal expansion of said covering layer matches said coefficient of thermal expansion of said base layer.

21. The element as defined in claim 14, wherein said base layer has a thickness of at least 5 mm and said covering layer has a thickness of from 0.01 to 100 μm, so that physical properties of the substrate are determined by physical properties of said base layer.

22. A process for making an element for extreme ultraviolet microlithography, said process comprises the steps of:

a) providing a substrate a base layer consisting of a ceramic or glass ceramic material having a coefficient of thermal expansion of at most 10 ppb/° C. and a covering layer applied over the base layer, said covering layer having a surface roughness of at most 0.5 nm rms and a coefficient of thermal expansion of at most 0.5 ppm/° C. said covering layer comprising at least one individual layer;

b) if appropriate, polishing the covering layer; and c) providing a reflective layer adhering to the covering layer.

23. The element as defined in claim 22, wherein the reflective layer is a multilayer coating consisting of alternating layers of Mo and Si.

24. The element as defined in claim 22, further comprising an absorbing layer, provided over the reflective layer.

* * * * *